United States Patent
Gokingco et al.

(10) Patent No.: US 9,627,424 B2
(45) Date of Patent: Apr. 18, 2017

(54) PHOTODIODES FOR AMBIENT LIGHT SENSING AND PROXIMITY SENSING

(71) Applicant: Silicon Laboratories Inc., Austin, TX (US)

(72) Inventors: Jefferson L. Gokingco, Austin, TX (US); Moshe M. Altmejd, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 84 days.

(21) Appl. No.: 14/547,761

(22) Filed: Nov. 19, 2014

(65) Prior Publication Data

US 2016/0141322 A1    May 19, 2016

(51) Int. Cl.
- *G01J 3/50* (2006.01)
- *H01L 27/146* (2006.01)
- *H01L 31/16* (2006.01)

(52) U.S. Cl.
CPC .. *H01L 27/14621* (2013.01); *H01L 27/14647* (2013.01); *H01L 31/165* (2013.01)

(58) Field of Classification Search
CPC ....... G01J 1/0492; G01J 1/1626; G01J 1/4204
USPC .......................................... 250/226, 214 AL
See application file for complete search history.

(56) References Cited

U.S. PATENT DOCUMENTS

| | | |
|---|---|---|
| 4,253,764 A | 3/1981 | Morrill |
| 4,775,853 A | 10/1988 | Perez Borruat |
| 4,779,980 A | 10/1988 | Hulstrom et al. |
| 6,201,250 B1 | 3/2001 | Morlock |
| 6,426,503 B1 | 7/2002 | Wuest |
| 8,003,945 B1 | 8/2011 | Wong |
| 8,008,613 B2 | 8/2011 | Tam |
| 8,275,413 B1 | 9/2012 | Fraden et al. |
| 8,400,627 B2 | 3/2013 | Jak et al. |
| 8,415,626 B1 | 4/2013 | Wong |
| 8,598,672 B2 | 12/2013 | Wang et al. |
| 8,624,341 B2 | 1/2014 | Holenarsipur et al. |
| 8,749,007 B1 | 6/2014 | Kerness et al. |
| 8,779,540 B2 | 7/2014 | Kerness et al. |
| 8,791,404 B2 | 7/2014 | Kerness et al. |
| 8,803,068 B2 | 8/2014 | Kerness et al. |
| 8,803,270 B2 | 8/2014 | Holenarsipur et al. |
| 8,922,788 B2 | 12/2014 | Addison et al. |
| 9,224,884 B2 | 12/2015 | Kerness et al. |
| 9,224,890 B1 | 12/2015 | Kerness et al. |
| 2004/0235431 A1 | 11/2004 | Jung |
| 2007/0187579 A1 | 8/2007 | Wunderer et al. |

(Continued)

*Primary Examiner* — Thanh Luu
(74) *Attorney, Agent, or Firm* — Zagorin Cave LLP

(57) ABSTRACT

Ambient light sensing and proximity sensing is accomplished using pairs of stacked photodiodes. Each pair includes a shallow diode with a shallow junction depth that is more sensitive to light having a shorter wavelength and a deeper diode with a deeper junction depth more sensitive to light with longer wavelengths. Photodiodes receiving light passed through cyan, yellow, and magenta filters and light passed without a color filter are used to generate red, green, and blue information through a subtractive approach. The shallow diodes are used to generate lux values for ambient light and the deeper diodes are used for proximity sensing. One or more of the deep diodes may be used in correction to lux determinations of ambient light.

16 Claims, 4 Drawing Sheets

(56) References Cited

U.S. PATENT DOCUMENTS

| | | |
|---|---|---|
| 2007/0268533 A1* | 11/2007 | Kijima .................. H04N 5/335 358/512 |
| 2010/0032569 A1 | 2/2010 | Kita |
| 2010/0051017 A1 | 3/2010 | Xie et al. |
| 2010/0181485 A1 | 7/2010 | Legras |
| 2011/0007306 A1 | 1/2011 | Jak et al. |
| 2011/0008525 A1 | 1/2011 | Dalakos et al. |
| 2011/0064114 A1 | 3/2011 | Zettler et al. |
| 2011/0248170 A1 | 10/2011 | Holcombe et al. |
| 2012/0018637 A1 | 1/2012 | Mitani |
| 2012/0187280 A1 | 7/2012 | Kerness et al. |
| 2012/0187281 A1 | 7/2012 | Kerness et al. |
| 2012/0187512 A1 | 7/2012 | Wang et al. |
| 2012/0187513 A1 | 7/2012 | Holenarsipur et al. |
| 2012/0187515 A1 | 7/2012 | Kerness et al. |
| 2012/0205765 A1 | 8/2012 | Hynecek |
| 2013/0057699 A1 | 3/2013 | Ooki |
| 2013/0085729 A1 | 4/2013 | Tsuruta et al. |
| 2013/0179078 A1 | 7/2013 | Griffon |
| 2013/0292706 A1 | 11/2013 | Costello et al. |
| 2013/0324819 A1 | 12/2013 | Colvin, Jr. |
| 2013/0325357 A1 | 12/2013 | Walerow |
| 2014/0027876 A1 | 1/2014 | Holenarsipur et al. |
| 2014/0092238 A1 | 4/2014 | Sandhu et al. |
| 2014/0131576 A1* | 5/2014 | Park ...................... G01J 1/0492 250/338.1 |
| 2014/0155715 A1 | 6/2014 | Chen et al. |
| 2014/0176944 A1 | 6/2014 | Addison et al. |
| 2014/0210028 A1* | 7/2014 | Chen ...................... G02B 1/105 257/432 |
| 2014/0267170 A1 | 9/2014 | Mckiel, Jr. |
| 2014/0284748 A1 | 9/2014 | Kerness et al. |
| 2014/0288400 A1 | 9/2014 | Diab et al. |
| 2014/0374600 A1 | 12/2014 | Gokingco et al. |
| 2016/0041029 A1 | 2/2016 | T'Ng et al. |
| 2016/0118509 A1 | 4/2016 | Altmejd et al. |

* cited by examiner

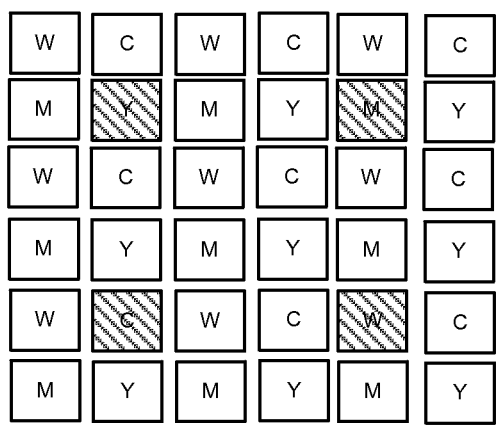
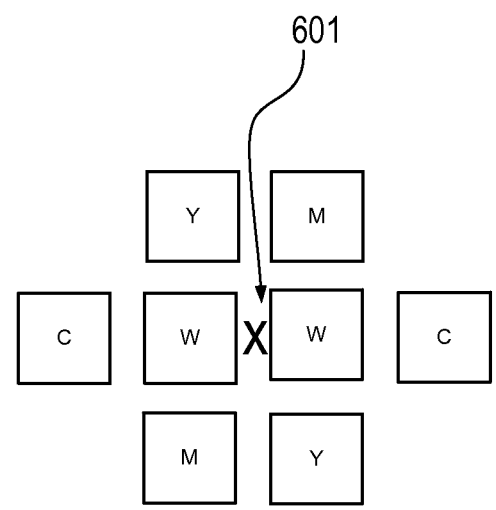
Fig. 6A
Fig. 6B

PHOTODIODES FOR AMBIENT LIGHT SENSING AND PROXIMITY SENSING

BACKGROUND

Field of the Invention

The invention relates to light sensing and more particularly to ambient light sensing and proximity sensing.

Description of the Related Art

Ambient light sensing may be used in devices to, e.g., control brightness of liquid crystal display (LCD) screens or for use with photography. Light sensors are also used to detect reflected light in order to determine the presence of an object and detect gestures. Given widespread use of applications for light sensors, it would be desirable to provide more effective and/or efficient light sensors.

SUMMARY OF EMBODIMENTS OF THE INVENTION

Accordingly, in one embodiment a method includes receiving light at a plurality of filters. The received light is sensed at a first plurality of photodiodes in performing ambient light sensing. The received light is also sensed at a second plurality of the photodiodes to perform proximity detection. The first plurality of diodes comprise photodiodes having a shallower junction depth with respect to a surface of the semiconductor closest to the filters than a deeper junction depth of the second plurality of photo diodes.

In another embodiment an apparatus includes a plurality of pairs of photodiodes that supply respective signals for use in sensing ambient light and for use in proximity sensing. Each pair includes a shallow photodiode and a deep photodiode. The deep photodiode is deeper with respect to a surface on which sensed light is incident and the deep diode is more sensitive to light having longer wavelengths than the shallow photodiode. A proximity detector circuit is configured to receive one or more first signals from one or more of the deep photo diodes for use in determining proximity of a target. An ambient light sensor circuit is coupled to receive signals indicative of sensed light from respective shallow photodiodes for use in ambient light sensing.

In another embodiment an apparatus includes an integrated circuit die having a first surface area. A plurality of shallow diodes are disposed below the first surface area. A plurality of deep diodes are disposed below the first surface area and below the first plurality of shallow diodes. A magenta filter that substantially blocks green light supplies first filtered light to a first diode of the shallow diodes. A cyan filter that substantially blocks red light supplies second filtered light to a second diode of the shallow photo diodes. A yellow filter that substantially blocks blue light supplies third filtered light to a third diode of the shallow photo diodes; and a fourth shallow diode is configured to receive white light.

BRIEF DESCRIPTION OF THE DRAWINGS

The present invention may be better understood, and its numerous objects, features, and advantages made apparent to those skilled in the art by referencing the accompanying drawings.

FIGS. 6A and 6B illustrate embodiments of arrays of photodiodes that can be used in embodiments herein.

The use of the same reference symbols in different drawings indicates similar or identical items.

DETAILED DESCRIPTION

Ambient light sensing presents challenges related to the use of imperfect sensors to approximate human eye perception. Human light perception is represented in the well known photopic curve that depicts the sensitivity of human perception at different wavelengths. Human eyes are most sensitive to green light at approximately 550 nanometers. In contrast, photodiodes on silicon are sensitive to both visible (400 nm to 700 nm) as well as near infrared wavelengths (700 nm to 1500 nm). Ambient light sensing typically detects red, green, and blue (RGB) light in determining light intensity levels measured in lux. Proximity sensing typically uses near infrared illumination of targets because such wavelengths are invisible to humans and ambient light has low energy in that region of the spectrum.

An RGB color sensor typically uses an array of colored filters placed on top of the photodiodes. Normally, the photodiodes cannot be used for both ambient light sensing and proximity detection because proximity detection requires photodiodes responsive to near infrared and RGB color sensing requires photodiodes sensitive to visible light. The filters used for RGB color sensing pass the 'color of interest'. The effect of these filters on infrared light varies. A 'red' filter has a different infrared response compared to the 'blue' filter. In addition, RGB color sensors typically need an additional IR-blocking filter to completely remove the residual infrared effects. Thus, the photodiodes cannot be reused between the functions of ambient light sensing and proximity detection.

Figure 1:
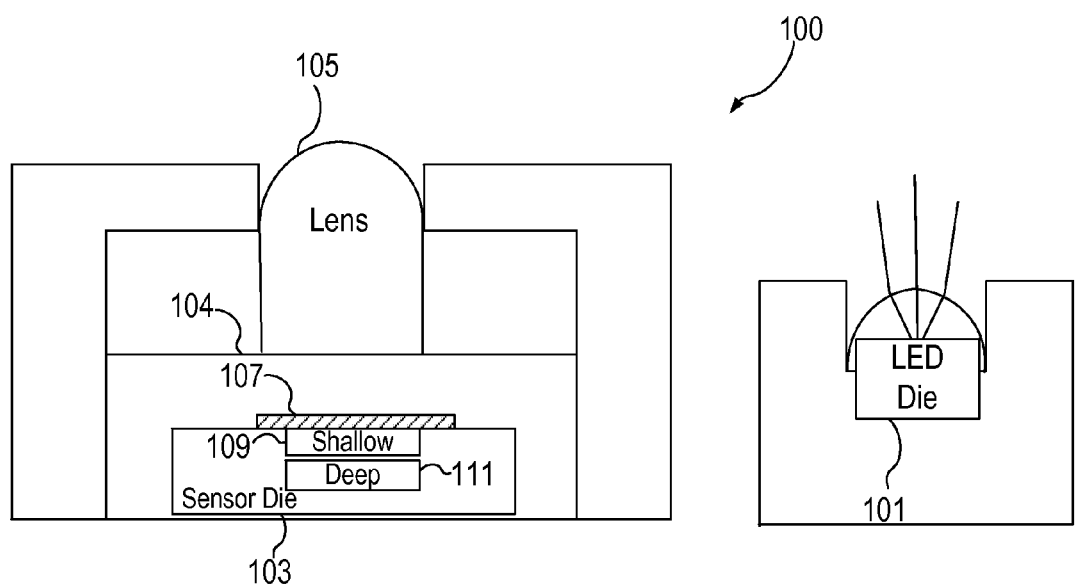
FIG. 1 illustrates an embodiment that provides both ambient light sensing and proximity sensing.

However, in embodiments described herein, both ambient light sensing and proximity sensing can be accomplished using photodiodes in the same region of the integrated circuit having different junction depths. Referring to FIG. 1, an apparatus 100 implements both proximity detection and ambient light sensing. Proximity detection involves the illumination of a target object (not shown) using an LED 101. Typically the LED emits light in the near infrared region, e.g., at 940 nm. The LED light reflects off of the target object, if present, and is sensed in one or more photodiodes located in sensor die 103. A lens 105 above the sensor die 103 may be used to guide light to the sensor die 103. The system 100 includes a color filter 107 above photodiodes 109 and 111. Photodiode 109 is shown to be shallower than the deeper photodiode 111. While, only a single pair of shallow and deep photodiodes are shown in the cross section of FIG. 1, as will be explained in more detail herein, a plurality of photodiode pairs located in a common region of the sensor die 103 are used to implement both ambient light sensing and proximity sensing.

Referring still to FIG. 1, showing a cross section, use of stacked photodiodes provides the ability to use the same area of the silicon die for both ambient light sensing and proximity detection. The photoelectric effect on the diode, how much current is generated for a particular wavelength, is a function of junction depth of the diode. To create a photodiode sensitive to visible light, the PN junction for shallow photo diode 109 is placed close to the surface. On the other hand, to create a photodiode sensitive to near infrared light, the PN junction of photo diode 111 is deeper with respect to the surface on which the light is incident. Providing shallow and deep pairs of stacked photodiodes is readily accomplished using conventional semiconductor processes. Shorter wavelength light such as blue and green light are more strongly sensed by the shallow photodiodes and longer wavelength light such as near infrared are better sensed by the deeper photodiodes. FIG. 1 also shows a filter 107 for use with the diode pair 109 and 111 whose function is explained more below.

Rather than use band pass filters that pass red, blue, and green light, embodiments herein use 'band-reject' color filters instead. For example, a typical red color filter passes red light, but blocks green and blue wavelengths. A band-reject filter for red light on the other hand, rejects red light but passes other light outside the red portion of the spectrum. In particular, the band-reject filter for red light also passes near infrared light, needed for proximity sensing. Similarly, band-reject filters for blue and green light are also used. The blue band-reject filter rejects blue light but passes other light. The green band-reject filter rejects green light but passes other light including infrared.

Figure 2:
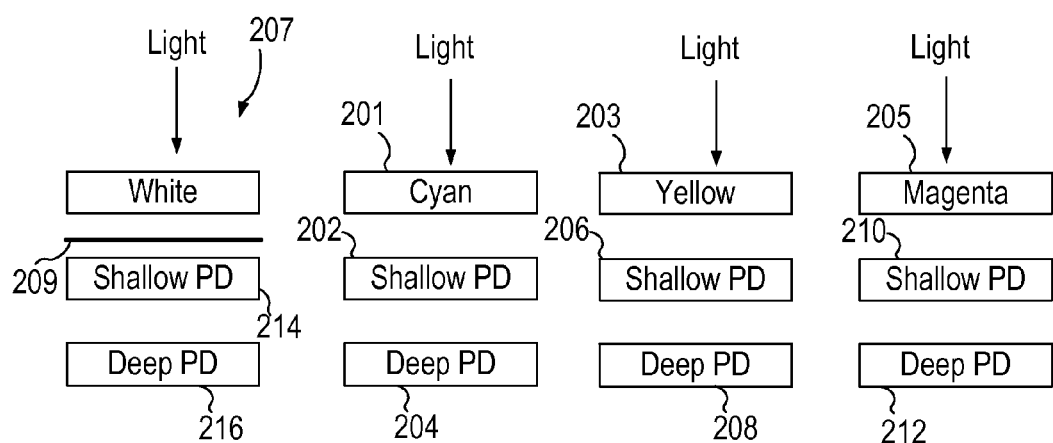
FIG. 2 illustrates stacked photodiode pairs that may be used in the embodiment of FIG. 1.

FIG. 2 illustrates an embodiment of a cross section of a photodiode array that may be utilized in embodiments. As shown in FIG. 2, a cyan filter 201 is utilized as the red band-reject filter that blocks red light but passes light above and below the red wavelengths to shallow photodiode 202 and deep photodiode 204. A yellow filter 203 blocks blue light but passes light above and below the blue region to shallow photodiode 206 and deep photo diode 208. A magenta filter 207 blocks green light but passes light above and below the green region to shallow photodiode 210 and deep photodiode 212. Finally a photodiode pair 214 and 216 is left unfiltered to sense white (broad spectrum) light incident on the sensor die. Thus, cyan, magenta and yellow filters are placed over individual stacked sensor pairs, while leaving a diode pair uncovered, in order to obtain red, green, blue, photopic and scotopic response measurements while rejecting spurious components in the IR and photodiode leakage current. Note that as mentioned previously the photopic response reflects human perception at certain light levels and the scotopic response reflects human perception at lower light levels.

Figure 3:
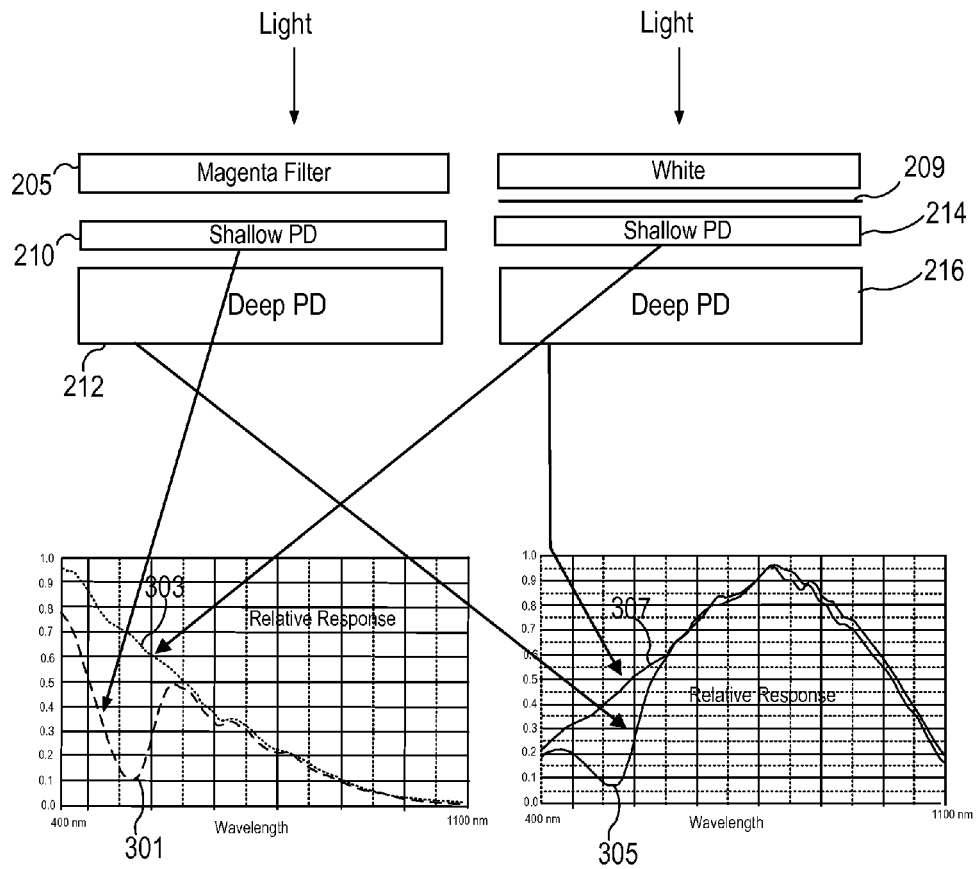
FIG. 3 illustrates different responses by shallow and deep photodiodes to light passed through a magenta filter and to white light.

Referring to FIG. 3, a response for shallow and deep photodiodes for a magenta filter and for white light is illustrated. Curve 301 illustrates the response of the shallow photodiode 210 under the magenta filter 205. Curve 303 shows the response of the shallow photodiode 214 to white light. As can be seen, the curve 301 has a lower response in the green region. If the curve 301 (magenta) is subtracted from the curve 303 (white), green light is provided. As also can be seen, the response to higher wavelength light is very low for the shallow photodiodes as compared to the deep photodiodes shown at curves 305 and 307. Curve 305 represents the response of the deep photodiode 212 under the magenta filter. Again there, is a dip in the green region but a much stronger response at high wavelengths. The deep photodiode 216 response to white light is shown at curve 307.

The required color filters are placed over the photodiode sensors while leaving one sensor uncovered (white). The required cyan, yellow and magenta filters have a transmission close to 1 in most of the band and dip lower in the area where they are designed to discriminate, as shown e.g., in curve 301. For example, a practical cyan filter has a transmission close to 0.95 everywhere except in the red region. Thus (1−(1/0.95)*cyan) yields red. Red, green, blue, photopic and scotopic responses can be determined by subtracting the sensor signals as follows:

Red=$G_{red}$(White−$K_{cyan}$Cyan)

Green=$G_{green}$(White−$K_{magenta}$Magenta)

Blue=$G_{blue}$(White−$K_{yellow}$Yellow)

Photopic=$G_{photopic}$(White−$K_{photopic}$Photopic)

Scotopic=$G_{scotopic}$(White−$K_{scotopic}$Scotopic)

The coefficients $K_{cyan}$, $K_{magenta}$, $K_{yellow}$, $K_{photopic}$, $K_{scotopic}$, compensate for the fact that the filters used to pass the light in the pass band portion of the spectrum have some loss. The gain coefficients $G_{red}$, $G_{green}$, $G_{blue}$, $G_{photopic}$, $G_{scotopic}$ are designed to compensate for photodiode spectral response.

Unfortunately, it is also necessary to consider the effects of photodiode leakages and current leakages from circuits associated with the photodiodes. As an example, the equation for Green is the following, with leakages represented:

Green=$G_{green}$(White−White$_{leakage}$−$K_{magenta}$(Magenta−Magenta$_{leakage}$))

Leading to:

Green=$G_{green}$(White−$K_{magenta}$Magenta−error)

where error=White$_{leakage}$−$K_{magenta}$ Magenta$_{leakage}$

To make matters worse, the error term shown is an exponential function of temperature, as the photodiodes are sensitive to temperature. The error term can be cancelled if the coefficients ($K_{cyan}$, $K_{magenta}$, $K_{yellow}$, $K_{photopic}$, $K_{scotopic}$) are equal to one. Referring again to FIG. 2, in an embodiment the white photodiode is masked with a metal layer 209 formed, e.g., of aluminum or copper in the sensor die 103, to block approximately the same percentage of light as is lost in the pass band of the band-reject filters. The metal layer is designed to block/reflect all wavelengths of light and achieves a precise attenuation of the incident light by covering a certain percentage of the area, e.g. it may cover 2.5% of the photodiode area yielding a 97.5% transmission factor value to balance a color filter that passes 97.5% of the light. Use of the mask provides better cancellation of the error term.

The masking technique works even if the white and colored sensor sizes differ. For example, assume the white photodiode is one half the size of the magenta photodiode. The formula Green=(2×White(with some attenuating metal)−Cyan) yields an accurate green that removes "leakage currents" due to diode area. Mismatched photodiode sizes are usually not used because the different ratios of perimeter to area affect leakage matching, but some embodiments may use mismatched sizes, especially for large diodes. Note that the subtractive method described herein (e.g., white minus magenta to obtain green) automatically accounts for error due to infrared since both the white and the cyan, yellow, or magenta sensors have similar errors due to infrared.

Because the cyan, yellow and magenta filters pass the longer wavelengths as part of their pass band, the deep photodiodes underneath those filters can still sense the near infrared or other appropriate longer wavelength used for proximity sensing. Thus, while the shallow diodes are used to generate RGB and are used for ambient light sensing, the deep diodes can still be used for proximity detection. Thus, the same surface area of the integrated circuit, under which the stacked photodiodes are disposed, can be used for both functions.

The stacked photodiodes can be used to determine the infrared 'color'. The depth of photodiode PN junction inherently governs the spectral responses due to the fact that light of different wavelength is absorbed and converted to current carriers. The relative response between a 'shallow' diode relative to a 'deep' diode is an effective method of determining the infrared 'color'. The ratio of measurements from deep and shallow diodes can be used as a simple color temperature or IR content indicator with or without the help of the band-reject filters. The ratio can be used for photo diode pairs without deposited filters on top but the use of the ratio is even more effective when a complementary (C or M or Y) filter is attached because the ratio between deep and shallow diodes is generated while one of the three primary energy band is reduced. In an embodiment the ratio is calculated as $\int_{\lambda_1}^{\lambda_2}(\text{Filter}(\lambda) \times \text{Illumination}(\lambda) \times (\text{DeepResponse}(\lambda)/\text{ShallowResponse}(\lambda))$ where $\lambda$ is wavelength, Filter($\lambda$) is the filter response, e.g., as shown in FIG. 3 for the magenta filter, Illumination($\lambda$) is illuminance at a given wavelength, and the DeepResponse and ShallowResponse are the output of the photodiodes. In photometry, illuminance is the total luminous flux (e.g. lumens) incident on a surface, per unit area (e.g. square meters). It is a measure of how much the incident light illuminates the surface, wavelength weighted by the luminosity function to correlate with human brightness perception. Lumens/square meter is also known as 'lux'. Illumination($\lambda$) is similar in concept to illuminance, except that Illumination($\lambda$) is illuminance at a given wavelength. Illumination($\lambda$) in the equation above is in the units of lux per nm (or lumens per square meter per nm). Another way of thinking of this is that $$\text{Illuminance} = \int_0^\infty \text{Illumination}(\lambda) d\lambda \text{ or}$$

$$\text{Illuminance} = \int_0^\infty \text{Irradiance}(\lambda) * V(\lambda) d\lambda$$

where $V(\lambda)$ is the luminosity function and Irradiance($\lambda$) is in Watts per square meter per nm.

By comparing the ratio for white (W), cyan (C), magenta (M), and yellow (Y), the three visible color portions can be removed leaving only the IR. If there was only IR in the illumination then the four ratios would be substantially identical. If there was only visible (RGB) light in the illumination then the ratio under C M Y filters would be higher than under no filter.

Figure 4:
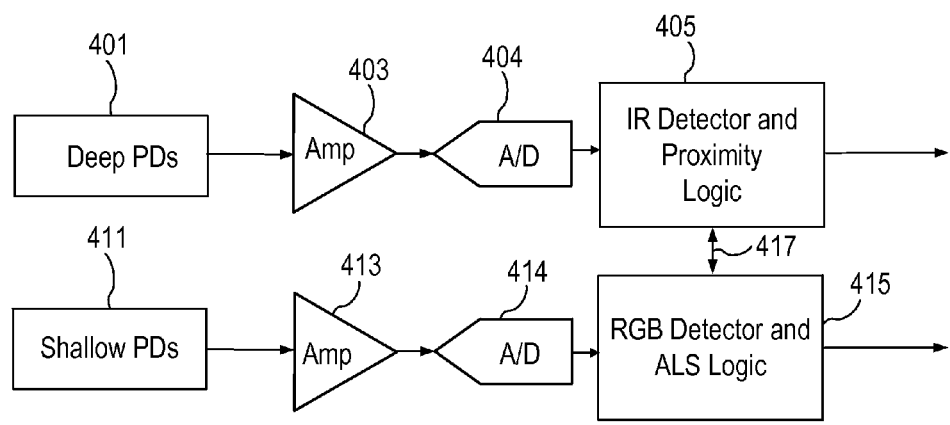
FIG. 4 illustrates high level block diagrams of additional details of a system that implements proximity detection and ambient light sensing.

Referring to FIG. 4, a high level block diagram illustrates a system for proximity detection and ambient light sensing according to an embodiment. As shown in FIG. 4, the deep photo diodes 401 supply a voltage or current corresponding to the sensed light to one or more amplifiers 403, which in turns supplies the amplified signal(s) corresponding to the sensed light through analog-to-digital converter(s) 404 to IR detector and proximity logic 405. That logic 405 may include a microcontroller, or other logic to implement the detection and control functions to detect a target based on reflected light. For example, in one embodiment, the proximity detector senses light with the LED 101 (FIG. 1) off so as to obtain a background light level. The control logic controls the LED to turn on and light is sensed after turning on the LED 101. The two readings may be compared by the detection logic 405 to determine whether an object is present. If an object is present, the two readings (with LED off and on) will be different due to reflection of LED light off of the proximate object. If there is no object to reflect light, any difference between the two readings will be sufficiently small as to indicate no object.

As also shown in FIG. 4, the shallow photo diodes 411 supply a voltage or current corresponding to the sensed light to one or more amplifiers 413, which in turn supplies the amplified signal(s) corresponding to the sensed light to through analog to digital converter(s) 414 red green blue (RGB) detector and ambient light sensing (ALS) logic 415. That logic may include a microcontroller, or other logic to implement the detection and control functions to determine ambient light described herein. Note that information from the shallow photo detectors may be utilized by the IR detector and proximity logic and information from the deep photodiodes may be utilized by the ALS logic as explained further herein. The sharing of shallow and deep photodiode information is indicated by interconnection 417. Note that multiplexors (not shown in FIG. 4) may be used to allow the number of photodiodes in use to exceed the number of A/D converters. In an embodiment two A/D converters are used to simultaneously measure the output of the white and filtered photodiode pair (two shallow or two deep measurements at the same time). That allows a more accurate simultaneous dual reading to be made. However, the multiplexors may be a source of leakage current and thus may need to be accounted for in the equations described above.

In one embodiment, the goal of ambient light sensing is to measure a light level that corresponds to human perception. Light intensity may be measured in lux, which provides a measure of light intensity as perceived by the human eye. The ideal way to measure the lux light level would be to use a perfectly shaped standard photopic or scotopic filter with a response curve of the filter and sensor being the same as the one published standard. However, creating a precise photopic curve is both difficult and expensive. Instead, one embodiment uses a multi-step approach to arrive at a more accurate lux value for ALS. In the first step, green light is used as an initial lux approximation. Then, red, blue, and infrared colors are computed. Finally, a correction factor is applied to the initial lux approximation.

Figure 5:
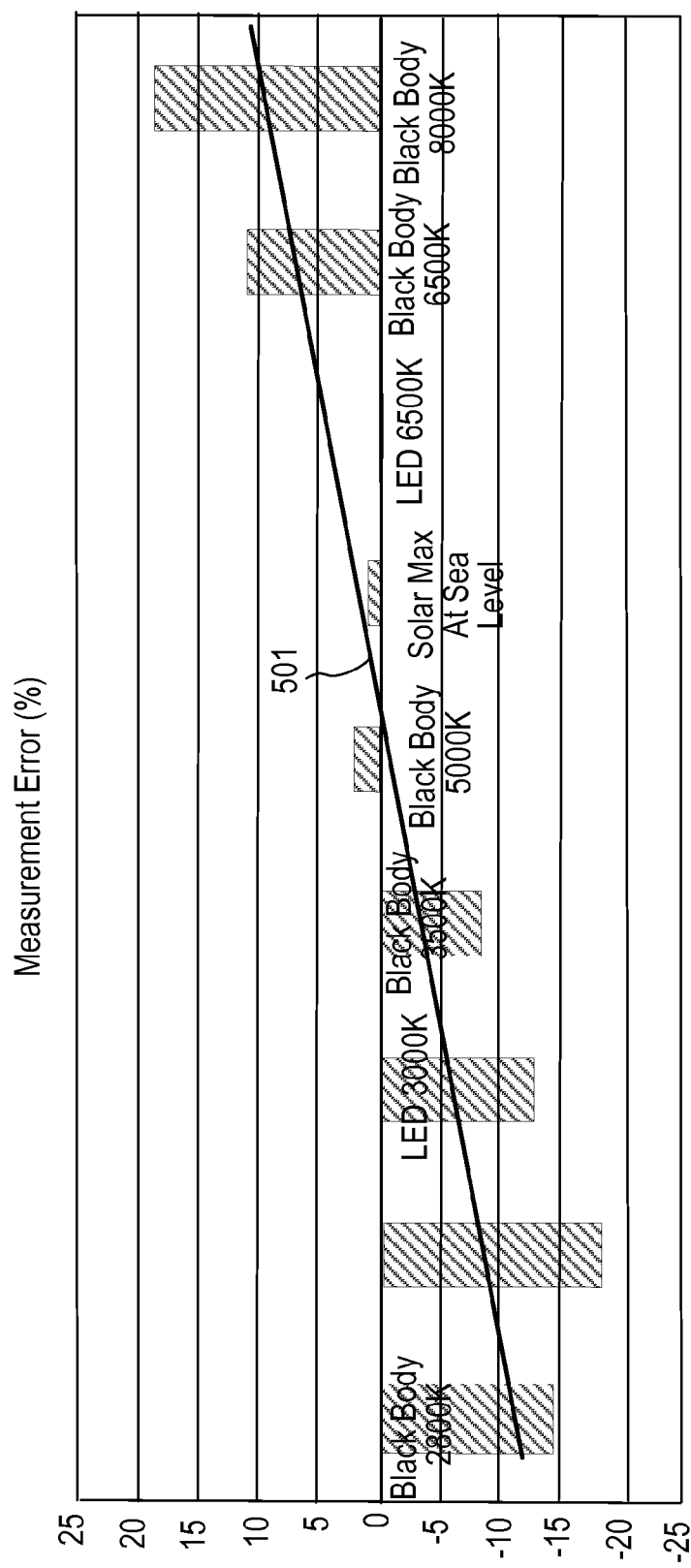
FIG. 5 illustrates an exemplary measurement error chart and an exemplary linear curve fitting approach.

The first step is to compute the green component of the light. The green component of the light can be achieved by either directly using a green filter, or through subtraction techniques (subtracting magenta from white). The second step involves the use of the computation of the red, blue and infrared components of the light to arrive at a linear correction to the estimate based on sensed green light. FIG. 5 shows an exemplary error distribution when a typical green rather than photopic curve is used with different color lights. As can be seen in the example of FIG. 5, the magnitude and direction of the error is tightly associated with the color temperature of the exciting light shown along the x axis.

A typical correction factor can be calculated in many ways but in one embodiment the correction factor is determined using curve fitting to fit a curve to the errors shown in FIG. 5. For example, in a simple example, a linear curve 501 fits the error illustrated in FIG. 5. In other embodiments, more complex curve fitting approaches may be utilized.

In order to use the error distribution such as illustrated in FIG. 5, the color temperature of the exciting light needs to be determined. Color temperature is measured in Kelvin and refers to the well known black body radiation theory that shows that hot objects radiate with a well defined spectral energy distribution curve that is a function of the temperature of the body. The hotter the body, then the shorter the wavelength at the peak of this curve. Sunlight for example is a hotter block body than a household incandescent lamp and thus has more blue content. Light sources are often rated by their color temperature even if they are not black body radiators. The rating means that the ratio of the energy in the red, green, and blue parts of the source's spectrum is close to the ratio in the light of a black body radiator at that temperature. Such ratings are not always perfect. For example, there are no black body sources where green energy is less than both blue and red but such sources can be built. If the sensing instrument has access to the color temperature of the incoming light then the resulting error can be significantly reduced.

The color temperature can be measured by a variety of ways. For example, color temperature may be determined by reading the relative intensity of several colors. In one embodiment, the ratios of blue to green light or red to green light along with the strength of IR readings can be used to approximate the color temperature. The RGB detector and ALS logic 415 (FIG. 4) may include memory that stores measurement error based on color temperature and the error curve. Lookup tables may be used to determine the color temperature based on the relative intensity of several colors as described. Once the color temperature of the source is determined, the ALS logic can generate a lux level by adjusting the green estimate based on the color temperature and the error shown in FIG. 5. The "colors" used for determining color temperature can be created with regular filters over sensors, or complementary color filters (C, Y, M) over sensors.

Note that with the approach of stacked photo diodes described herein, a matrix of color filters versus photodiode depth can be used to increase the accuracy of the ambient light sensing (ALS) lux readings by effectively allowing more color points to be measured. Thus, multiple points in the spectrum such as red, green and blue may be measured for 'shallow' and 'deep' photodiodes. The additional points may be useful in order to get closer to the correct needed response (photopic, scotopic, R. G or B). Note that a dual photodiode stack with three color filters (or white—the three complementary color filters), gives six filter curves.

There is a preferred solution for which of the photodiodes should be used in different situations to calculate the light brightness and color temperature. The most common situations common in consumer products: (1) under clear glass; (2) under visible light blocking paint with infrared (IR) transmission and (3) under grey glass that does not accentuate any color or IR. Because the visible light blocking paint has a rather intense IR interference, the shallower diodes in the stack should be used here since they naturally reject IR. Under clear glass the deep photo diodes are preferred for some colors because their lower leakage and UVA rejection makes them more accurate. Note that the glass is typically located above the lens 105 shown in FIG. 1.

Referring to FIGS. 6A and 6B different configurations of a top view of stacked diode arrays are shown having a common centroid. In FIG. 6A common centroids are shown in the shaded region. In FIG. 6B, there are two pairs of stacked photodiodes (only one of each stack is shown) for each color and for white. As can be seen in FIG. 6B, each diode pair has a centroid at 601. Thus, the centroid for the two diodes (W) that receive unfiltered light is at 601 as is the centroid for the diodes (Y) that receive light from a yellow filter (Y), the diodes (M) that receive light from a magenta filter, and the diodes (C) that receive light from a cyan filter. Having a common centroid for the various diodes helps overcome variations in the semiconductor die that may be present due process, voltage, or temperature.

Thus, various aspects of the use of stacked photodiodes have been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    performing ambient light sensing using a first plurality of photodiodes, the ambient light sensing including,
        filtering light in a magenta filter that substantially blocks green light and supplying first filtered light from the magenta filter to a first diode of the first plurality of photodiodes;
        filtering light in a cyan filter that substantially blocks red light and supplying second filtered light to a second diode of the first plurality of photodiodes;
        filtering light in a yellow filter than substantially blocks blue light and supplying third filtered light to a third diode of the first plurality of photodiodes;
        supplying broad spectrum light to a fourth diode of the first plurality of photodiodes;
        determining an estimate of green light, which includes subtracting light sensed by the first diode from light sensed by the fourth diode;
        determining an estimate of red light, which includes subtracting light sensed by the second diode from light sensed by the fourth diode;
        determining an estimate of blue light, which includes subtracting light sensed by the third diode from light sensed by the fourth diode; and
    performing proximity detection using a second plurality of photodiodes having a deeper junction depth with respect to the cyan, magenta, and yellow filters than the first plurality of photodiodes.

2. The method as recited in claim 1, wherein performing the proximity detection further comprises:
    receiving at least a portion of the first filtered light at a first deep diode of the second plurality of photodiodes.

3. The method as recited in claim 1, wherein performing the proximity detection further comprises:
    receiving at least a portion of the second filtered light at a second deep diode of the second plurality of photodiodes.

4. The method as recited in claim 1, wherein performing the proximity detection further comprises:
    receiving at least a portion of the third filtered light at a third deep diode of the second plurality of photodiodes.

5. The method as recited in claim 1, wherein performing the proximity detection further comprises:
    receiving at least a portion of the broad spectrum light at a fourth deep diode of the second plurality of photodiodes.

6. The method as recited in claim 1 wherein the ambient light sensing comprises using the estimate of green light as an initial lux approximation, and applying a correction factor to the initial lux approximation based on the estimate of blue light, the estimate of red light and an estimate of infrared provided by one or more of the second plurality of photodiodes.

7. The method as recited in claim 6, further comprising using sensed light from one or more of the second plurality of photodiodes in determining the correction factor.

8. A method comprising:
   filtering light in a magenta filter that substantially blocks green light and supplying first filtered light from the magenta filter to a first photodiode;
   filtering light in a cyan filter that substantially blocks red light and supplying second filtered light to a second photodiode;
   filtering light in a yellow filter than substantially blocks blue light and supplying third filtered light to a third photodiode;
   using a metal layer to block a percentage of incident broad spectrum light, the percentage being approximately a same percentage of light as is lost in respective passbands of the magenta, cyan, yellow filters; and
   supplying a remaining percentage of the incident broad spectrum light to a fourth photodiode.

9. An apparatus comprising:
   a plurality of pairs of photodiodes configured to supply respective signals for use in determining sensed ambient light and for use in proximity sensing;
   wherein each of the pairs of photodiodes includes a shallow photodiode and a deep photodiode, wherein the deep photodiode is deeper with respect to a surface on which sensed light is incident and the deep photodiode is more sensitive to light having longer wavelengths than the shallow photodiode;
   a proximity detector circuit configured to receive one or more first signals from one or more of the deep photodiodes for use in determining proximity of a target;
   an ambient light sensor circuit coupled to receive signals indicative of sensed light from respective shallow photodiodes for use in ambient light sensing;
   a plurality of pass filters disposed above respective pairs of the photodiodes;
   another pair of photodiodes including another shallow photodiode and another deep photo diode, the other pair of photodiodes configured to sense respective portions of incident white light; and
   a metal layer disposed above the other pair of photodiodes, the metal layer blocking approximately a same percentage of the incident white light as is blocked in respective passbands of the pass filters.

10. The apparatus as recited in claim 9 wherein a first of the pass filters is a magenta filter disposed above a first of the pairs of photodiodes and configured to pass light above and below green light and block green light, a second of the pass filters is a yellow filter disposed above a second of the pairs of photodiodes to pass light above and below blue light and block blue light, and a third of the pass filters is a cyan filter configured to pass light above and below red and block red light disposed above a third of the pairs of photodiodes.

11. The apparatus as recited in claim 9, wherein the deep photodiode and the shallow photodiode have different junction depths with respect to a surface on which sensed light is incident.

12. An apparatus comprising:
   an integrated circuit die having a first surface area;
   a plurality of shallow diodes being disposed below the first surface area;
   a plurality of deep diodes being disposed below the first surface area and below the plurality of shallow diodes;
   a magenta filter that substantially blocks green light and is configured to supply first filtered light to a first diode of the shallow diodes;
   a cyan filter that substantially blocks red light and is configured to supply second filtered light to a second diode of the shallow diodes;
   a yellow filter than substantially blocks blue light and is configured to supply third filtered light to a third diode of the shallow diodes; and
   a fourth diode of the shallow diodes configured to receive white light;
   a proximity detector circuit configured to receive one or more first signals from one or more of the deep diodes for use in determining proximity of a target;
   an ambient light sensor circuit coupled to receive signals indicative of sensed light from the shallow diodes for use in ambient light sensing; and
   wherein the ambient light sensor circuit is configured to determine an estimate of green light, at least in part, by subtracting light sensed by the first diode from light sensed by the fourth diode, and to determine an estimate of red light, at least in part, by subtracting light sensed by the second diode from light sensed by the fourth diode, and is configured to determine an estimate of blue light, at least in part, by subtracting light sensed by the third diode from light sensed by the fourth diode.

13. The apparatus as recited in claim 12 further comprising a light emitting diode to emit light to be sensed by the deep diodes.

14. The apparatus as recited in claim 12 further comprising a metal layer disposed above the fourth diode, the metal layer blocking approximately a same percentage of light as blocked in respective passbands of the cyan, yellow, and magenta filters.

15. The apparatus as recited in claim 12
   wherein the plurality of shallow and deep diodes are arranged in stacked photodiode pairs with each pair having one of the shallow diodes and one of the deep diodes.

16. The apparatus as recited in claim 15 wherein a first of the deep diodes is disposed to receive light from the magenta filter, a second of the deep diodes is disposed to receive light from the cyan filter, a third of the deep diodes is disposed to receive light from the yellow filter, and a fourth of the deep diodes is disposed to receive light passing through the fourth diode of the shallow diodes.

* * * * *